US009662928B2

(12) United States Patent
Chen

(10) Patent No.: US 9,662,928 B2
(45) Date of Patent: May 30, 2017

(54) METHOD FOR FABRICATING CURVED DECORATION PLATE AND CURVED DISPLAY DEVICE

(71) Applicant: Chunghwa Picture Tubes, Ltd., Taoyuan County (TW)

(72) Inventor: Yung-Chien Chen, Taoyuan County (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 412 days.

(21) Appl. No.: 14/580,231

(22) Filed: Dec. 23, 2014

(65) Prior Publication Data
US 2016/0121645 A1 May 5, 2016

(30) Foreign Application Priority Data

Oct. 31, 2014 (TW) .............................. 103137897 A

(51) Int. Cl.
*B29C 65/48* (2006.01)
*B32B 37/12* (2006.01)
(Continued)

(52) U.S. Cl.
CPC ............ *B44C 1/10* (2013.01); *B32B 38/0004* (2013.01); *B32B 38/10* (2013.01); *B44C 1/22* (2013.01);
(Continued)

(58) Field of Classification Search
USPC ............ 156/247, 249, 250, 252, 267, 272.2, 156/272.8, 278
See application file for complete search history.

(56) References Cited

U.S. PATENT DOCUMENTS 4,407,685 A * 10/1983 Hankland ........... B29C 37/0028
156/212
5,738,729 A * 4/1998 Dubs ....................... C23C 14/50
118/500
(Continued)

FOREIGN PATENT DOCUMENTS

CN 100476526 C 4/2009
JP 2005256101 A * 9/2005
(Continued)

OTHER PUBLICATIONS

English Abstract of JP 2005-256101 (Mar. 29, 2017).*

*Primary Examiner* — Sing P Chan
(74) *Attorney, Agent, or Firm* — Winston Hsu; Scott Margo

(57) ABSTRACT

A method for fabricating a curved decoration plate and a curved display device includes the following steps. First, a flexible film is provided. The flexible film is pre-cut along a pre-cutting line with a laser in an unfolded state to form a first part and a second part. Then, a curved substrate having an inner surface and an outer surface is provided. The inner surface includes a light-transmitting region and a peripheral region. Next, the flexible film is stuck on the inner surface and the first part is removed. A decoration material layer is then formed on the exposed inner surface of the curved substrate and the second part. Subsequently, the second part and the decoration material layer disposed thereon are removed.

12 Claims, 9 Drawing Sheets

(51) Int. Cl.
*B32B 38/04* (2006.01)
*B32B 38/10* (2006.01)
*B32B 43/00* (2006.01)
*B44C 1/10* (2006.01)
*B32B 38/00* (2006.01)
*B44C 1/22* (2006.01)
*H01L 51/56* (2006.01)
*B32B 37/24* (2006.01)
*B32B 38/16* (2006.01)
*H01L 51/52* (2006.01)

(52) U.S. Cl.
CPC ....... *B32B 38/162* (2013.01); *B32B 2037/243* (2013.01); *B32B 2037/246* (2013.01); *B32B 2255/00* (2013.01); *B32B 2307/412* (2013.01); *B32B 2315/08* (2013.01); *B32B 2451/00* (2013.01); *B32B 2457/20* (2013.01); *B32B 2457/206* (2013.01); *H01L 51/524* (2013.01); *H01L 51/56* (2013.01); *H01L 2251/5338* (2013.01)

(56) References Cited

U.S. PATENT DOCUMENTS

| | | | | |
|---|---|---|---|---|
| 5,803,976 | A * | 9/1998 | Baxter | C23C 14/562 118/718 |
| 5,843,235 | A * | 12/1998 | Bergman | C23C 14/042 118/504 |
| 5,879,741 | A * | 3/1999 | Itoh | C23C 14/22 118/718 |
| 5,979,312 | A * | 11/1999 | Williams | H05K 3/1225 101/127 |
| 6,082,296 | A * | 7/2000 | Tran | C23C 14/24 118/723 EB |
| 6,454,909 | B1 * | 9/2002 | Matsuse | C23C 16/45521 118/500 |
| 7,920,223 | B2 | 4/2011 | Nishizawa | |
| 8,367,440 | B2 * | 2/2013 | Takayama | H01L 21/76251 257/E21.567 |
| 8,415,208 | B2 * | 4/2013 | Takayama | H01L 21/76251 257/E21.567 |
| 9,174,307 | B2 * | 11/2015 | Lee | B23K 26/0604 |
| 9,202,987 | B2 * | 12/2015 | Takayama | H01L 21/76251 |
| 9,214,640 | B2 * | 12/2015 | Lee | H01L 51/0097 |
| 9,533,627 | B2 * | 1/2017 | Sugiura | B44C 5/0415 |
| 2003/0032210 | A1 * | 2/2003 | Takayama | H01L 21/76251 438/30 |
| 2003/0134488 | A1 | 7/2003 | Yamazaki | |
| 2005/0054198 | A1 * | 3/2005 | Um | C23C 16/45565 438/689 |
| 2007/0031600 | A1 * | 2/2007 | Devitt | C03B 35/147 427/248.1 |
| 2007/0139605 | A1 | 6/2007 | Matsuda | |
| 2009/0011146 | A1 * | 1/2009 | Yamada | C23C 16/511 427/575 |
| 2009/0239320 | A1 * | 9/2009 | Takayama | H01L 21/76251 438/27 |
| 2009/0255467 | A1 * | 10/2009 | Britt | C23C 14/024 118/718 |
| 2010/0075036 | A1 * | 3/2010 | Okazaki | C23C 14/02 427/255.5 |
| 2011/0076421 | A1 * | 3/2011 | Lee | C23C 16/045 427/569 |
| 2011/0253047 | A1 * | 10/2011 | Knipp | C23C 14/042 118/723 R |
| 2012/0006263 | A1 * | 1/2012 | Hashimoto | C23C 16/46 118/712 |
| 2012/0118367 | A1 * | 5/2012 | Song | H01G 9/2068 136/256 |
| 2013/0153393 | A1 | 6/2013 | Omote | |
| 2013/0214324 | A1 * | 8/2013 | Takayama | H01L 21/76251 257/100 |
| 2013/0288011 | A1 | 10/2013 | Wang | |
| 2013/0301113 | A1 * | 11/2013 | Pellegrino | G02B 26/08 359/298 |
| 2013/0335375 | A1 | 12/2013 | Nishikawa | |
| 2014/0183473 | A1 * | 7/2014 | Lee | H01L 51/0097 257/40 |
| 2015/0110987 | A1 * | 4/2015 | Liggins | C23C 16/274 428/64.1 |
| 2015/0114297 | A1 * | 4/2015 | Kawato | C23C 14/24 118/726 |
| 2016/0001536 | A1 * | 1/2016 | Ok | B32B 37/003 156/256 |
| 2016/0079283 | A1 * | 3/2016 | Takayama | H01L 21/76251 257/72 |
| 2016/0093477 | A1 * | 3/2016 | Rogers | C23C 14/0036 427/569 |
| 2016/0093683 | A1 * | 3/2016 | Lee | H01L 51/0097 257/40 |
| 2016/0121645 | A1 * | 5/2016 | Chen | B44C 1/10 156/247 |
| 2017/0047358 | A1 * | 2/2017 | Takayama | H01L 21/76251 |
| 2017/0062773 | A1 * | 3/2017 | Lee | H01L 51/0097 |

FOREIGN PATENT DOCUMENTS

| | | | |
|---|---|---|---|
| JP | 2010135802 | 6/2010 | |
| TW | 201216761 | 4/2012 | |
| TW | 201237708 | 9/2012 | |
| TW | I411985 | 10/2013 | |
| TW | 201343410 | 11/2013 | |
| TW | I431567 | 3/2014 | |
| TW | I444345 | 7/2014 | |
| WO | WO 8702509 A1 * | 4/1987 | ....... H01L 21/02381 |
| WO | 2013089017 A1 | 6/2013 | |

\* cited by examiner

METHOD FOR FABRICATING CURVED DECORATION PLATE AND CURVED DISPLAY DEVICE

BACKGROUND OF THE INVENTION

1. Field of the Invention

The present invention relates to a method for fabricating a curved decoration plate and a method for fabricating a curved display device, and more particularly, to a method for fabricating a curved decoration plate that utilizing a laser to pre-cut a flexible film and removing a part of the flexible film before forming a decoration layer.

2. Description of the Prior Art

Due to the advantages of its adjustable shapes based on diverse designs, curved display device has substituted conventional flat panel display device in recent years. A flexible display panel is required so as to make the display device into a curved structure. The organic light-emitting diode (OLED) display, due to its advantages such as self-luminance, wide viewing angle, faster response rate, lower power consumption, better contrast, greater brightness, thinner thickness, full color, simpler structure, and being operable in a broader temperature range, has been rapidly developed as the increased applications to the curved display devices.

A curved cover plate is required to protect the curved display panel and covers the curved display panel. The curved cover plate can also cover the area of the display panel which is not supposed to be shown. Although the curved display panel can be made by a conventional method for fabricating the flat display panel, the conventional screen printer could not print patterned layers on the curved surface. As a result, the decoration layer of the curved cover plate is confined by the limitation of the screen printer, and could not be produced by the conventional screen printing method.

SUMMARY OF THE INVENTION

It is therefore one of the objectives of the present invention to provide a method for fabricating a curved decoration plate and a method for fabricating a curved display device so as to solve the problem that the conventional screen printer could not form a decoration layer on an inner surface of a curved surface.

According an embodiment of the present invention, a method for fabricating a curved decoration plate is provided and includes the following steps. A first flexible film is provided. The first flexible film is pre-cut along a pre-cutting line with a laser in an unfolded state to form a first part and a second part, wherein the first part and the second part are respectively located at two sides of the pre-cutting line, and the first part and the second part are connected to each other. A curved substrate is provided, wherein the curved substrate has an inner surface and an outer surface, and the inner surface has a light-transmitting region and a peripheral region. The first flexible film is stuck on the inner surface, wherein the second part is disposed corresponding to the light-transmitting region, and the first part is disposed corresponding to the peripheral region. The first part of the first flexible film is removed and the inner surface in the peripheral region is exposed. A decoration material layer is formed on the exposed inner surface and the second part. The second part and the decoration material layer disposed on the second part are removed to form a decoration pattern layer on the inner surface of the peripheral region.

According another embodiment of the present invention, a method for fabricating a curved display device is provided and includes the following steps. A first flexible film is provided. The first flexible film is pre-cut along a pre-cutting line with a laser in an unfolded state to form a first part and a second part, wherein the first part and the second part are respectively located at two sides of the pre-cutting line, and the first part and the second part are connected to each other. A curved substrate is provided, wherein the curved substrate has an inner surface and an outer surface, and the inner surface has a light-transmitting region and a peripheral region. The first flexible film is stuck on the inner surface, wherein the second part is disposed corresponding to the light-transmitting region, and the first part is disposed corresponding to the peripheral region. The first part of the first flexible film is removed and the inner surface in the peripheral region is exposed. A decoration material layer is formed on the exposed inner surface and the second part. The second part and the decoration material layer disposed on the second part are removed to form a decoration pattern layer on the inner surface of the peripheral region. A flexible display panel is stuck on the inner surface and the decoration pattern layer.

In the method for fabricating the curved decoration plate and the method for fabricating the curved display device, a first flexible film is pre-cut to form a first part and a second part so as to let the first part and the second part still connect to each other but can be tore up to be separate from each other. In other words, the first part stuck on the curved substrate can easily be removed while the second part is still stuck on the curved substrate. Therefore, the decoration material layer disposed on the second part may be removed by tearing up the second part. As a result, the decoration pattern layer may be formed on the curved inner surface and therefore the problem that the conventional screen printer is unable to form a decoration pattern layer on the curved inner surface is solved.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
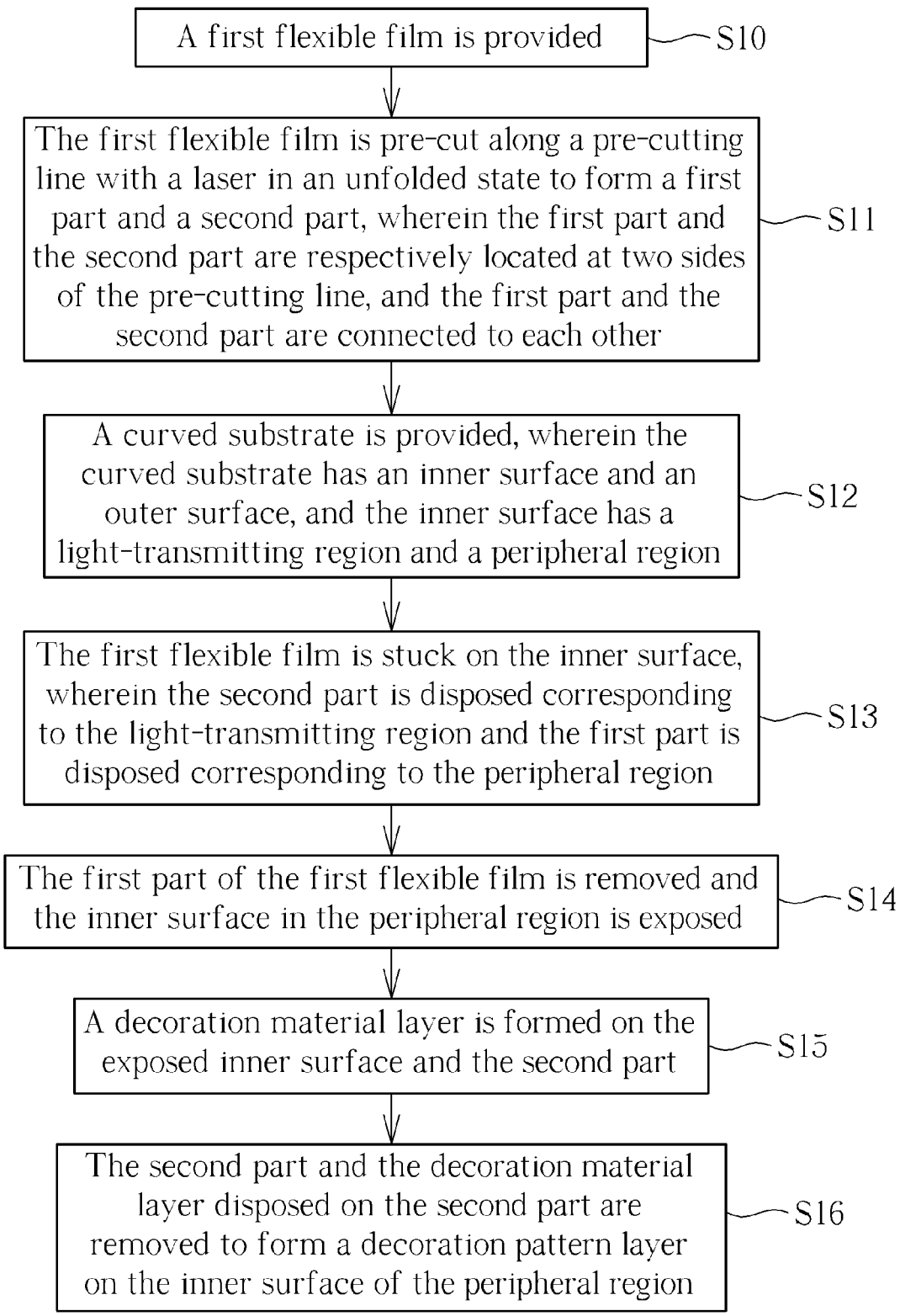
FIG. 1 is a flowchart schematically illustrating a method for fabricating a curved decoration plate according to a first embodiment of the present invention.

As shown in FIG. 1 to FIG. 11, a method for fabricating a curved decoration plate 112 according to a first embodiment includes the following steps:

Step S10: A first flexible film 100 is provided.

Step S11: The first flexible film 100 is pre-cut along a pre-cutting line 101 with a laser in an unfolded state to form a first part 100A and a second part 100B, wherein the first part 100A and the second part 100B are respectively located at two sides of the pre-cutting line 101, and the first part 100A and the second part 100B are connected to each other.

Step S12: A curved substrate 102 is provided, wherein the curved substrate 102 has an inner surface 102A and an outer surface 102B, and the inner surface 102A has a light-transmitting region 102C and a peripheral region 102D.

Step S13: The first flexible film 100 is stuck on the inner surface 102A, wherein the second part 100B is disposed corresponding to the light-transmitting region 102C, and the first part 100A is disposed corresponding to the peripheral region 102D.

Step S14: The first part 100A of the first flexible film 100 is removed and the inner surface 102A in the peripheral region 102D is exposed.

Step S15: A decoration material layer 108 is formed on the exposed inner surface 102A and the second part 100B.

Step S16: The second part 100B and the decoration material layer 108 disposed on the second part 100B are removed to form a decoration pattern layer 110 on the inner surface 102A of the peripheral region 102D.

Figure 2:
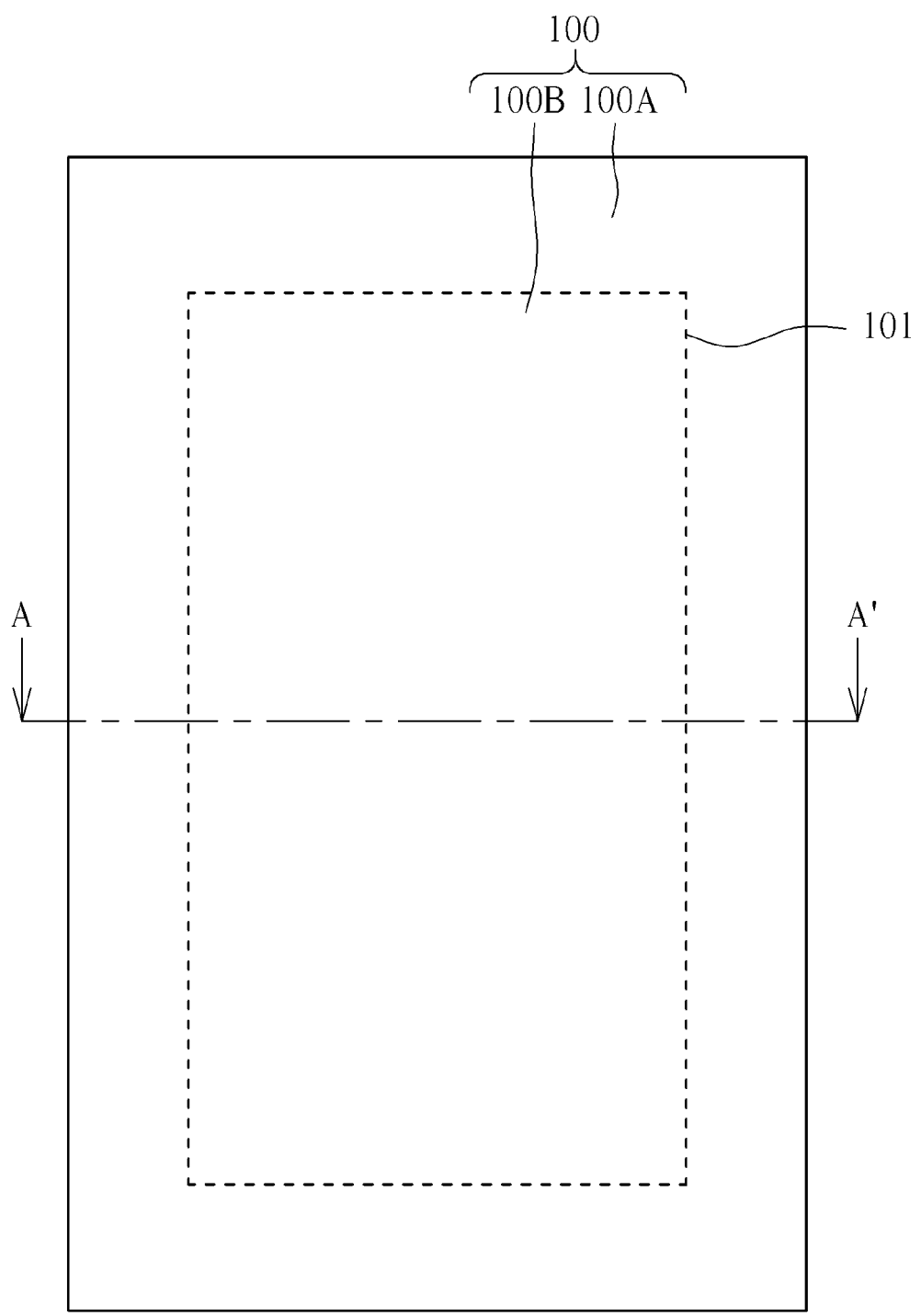
FIG. 2 is a top view schematically illustrating a first part and a second part of the first flexible film according to the first embodiment of the present invention.
Figure 3:
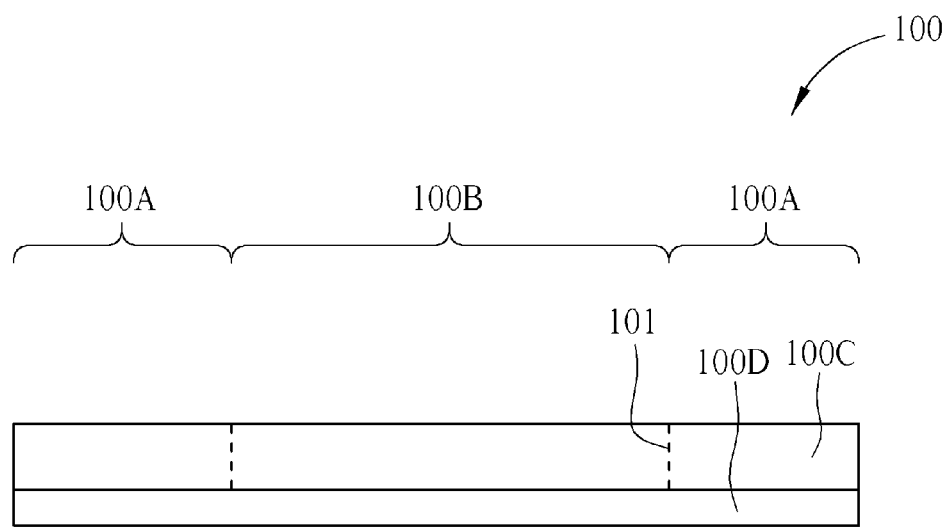
FIG. 3 is a cross-sectional view taken along line A-A' of FIG. 2.

More specifically, as shown in FIG. 2 and FIG. 3, the step S10 is performed first to provide a first flexible film 100. Then, the step S11 is performed to pre-cut the first flexible film 100 along a pre-cutting line 101 with a laser in an unfolded state to form a first part 100A and a second part 100B, wherein the first part 100A and the second part 100B are respectively located at two sides of the pre-cutting line 101, and the first part 100A and the second part 100B are connected to each other.

In the present embodiment, the first flexible film 100 may be a single sided tape or a paper tape, but not limited thereto. Specifically, the first flexible film 100 may include a first thin film 100C and a first adhesive layer 100D and the first adhesive layer 100D is stuck on a surface of the first thin film 100C so as to stick the first flexible film 100 on the curved substrate 102 in the following steps, but not limited thereto.

A material of the first thin film 100C may include a flexible thin film material, such as polyethylene terephthalate (PET) or polyethylene (PE), and a material of the first adhesive layer 100D may include epoxy, silicone resin, acrylic ester or other materials with suitable stickiness, but the present invention is not limited thereto.

Furthermore, in the step of pre-cutting the first flexible film 100, the laser may only cut off the first thin film 100C but not cut off the first adhesive layer 100D, for example, the laser may cut off a portion of the first adhesive layer 100D or the laser may not cut the first adhesive layer 100D. As a result, the side edges of the second part 100B of the first flexible film 100 is connected to the inner sides of the first part 100A via the first adhesive layer 100D.

It is worth noting that the first flexible film 100 is pre-cut with the laser so that the first part 100A and the second part 100B may easily be separated from each other by tearing up. In other embodiments, the laser may not cut off the first thin film 100C of the first flexible film 100 as long as the first part 100A and the second part 100B can be separate from each other via tearing up. In the present embodiment, the first part 100A surrounds the second part 100B, but not limited thereto, the layout of the first part 100A and the second part 100B may be adjusted for design considerations.

Figure 4:
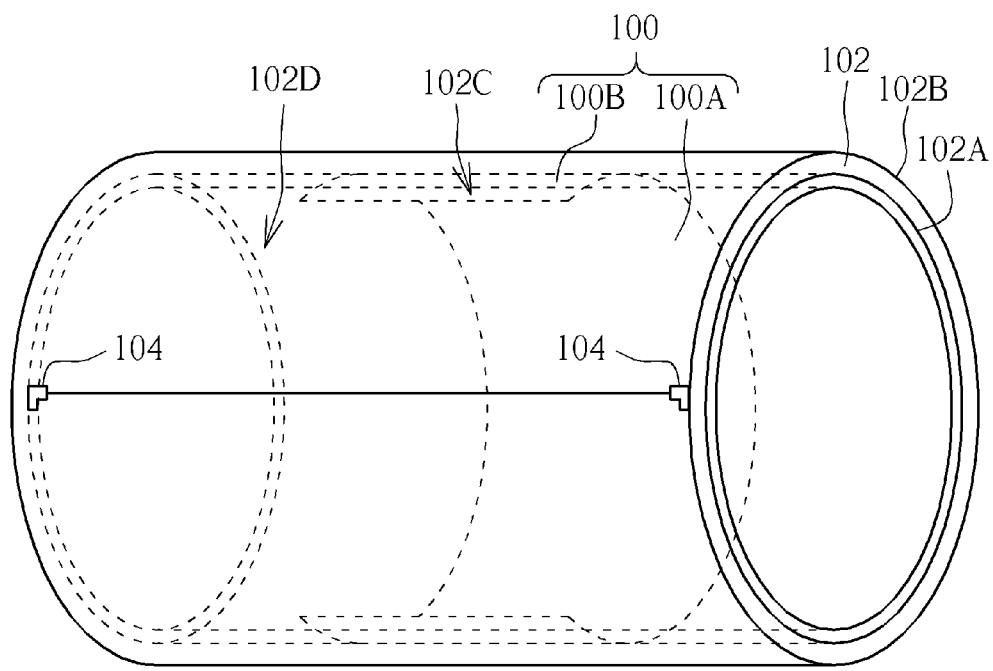
FIG. 4 is a schematic diagram illustrating the step of sticking the first flexible film on the inner surface of the curved substrate according to the first embodiment of the present invention.

Next, as shown in FIG. 4, the step S12 is performed to provide a curved substrate 102 such as a glass substrate, a plastic substrate or a quartz substrate, wherein the curved substrate 102 has an inner surface 102A and an outer surface 102B, and the inner surface 102A has a light-transmitting region 102C and a peripheral region 102D. Then, the step S13 is performed to stick the first part 100A and the second part 100B of the first flexible film 100 that are still connected to each other on the inner surface 102A. In the present embodiment, the curved substrate 102 may further include two alignment marks 104 to mark the position for sticking the first flexible film 100. Therefore, the step of sticking the first flexible film 100 on the inner surface 102A may include respectively aligning two corners of the first flexible film 100 to the alignment marks 104 before sticking the first flexible film 100 on the inner surface 102A so that the second part 100B and the first part 100A stuck on the inner surface 102A can be respectively disposed corresponding to the light-transmitting region 102C and the peripheral region 102D via the alignment marks 104.

For instance, the alignment marks 104 may respectively be L-shaped, and the linear direction constituted by linking the alignment marks 104 may be perpendicular to the uneven side edge of the curved substrate 102, such as a ring side edge or an arc-shaped side edge, but the present invention is not limited thereto.

The position of the alignment marks 104 and the linear direction constituted by linking the alignment marks 104 may be adjusted based on the shape of the first flexible film 100. Furthermore, the alignment marks 104 may be made of metal patterns, patterns constituted by other films, or patterns directly formed on the curved substrate 102 (for example, patterns formed by etching processes) that are invisible to users but can be detected by image detector. The present invention is not limited thereto.

Figure 5:
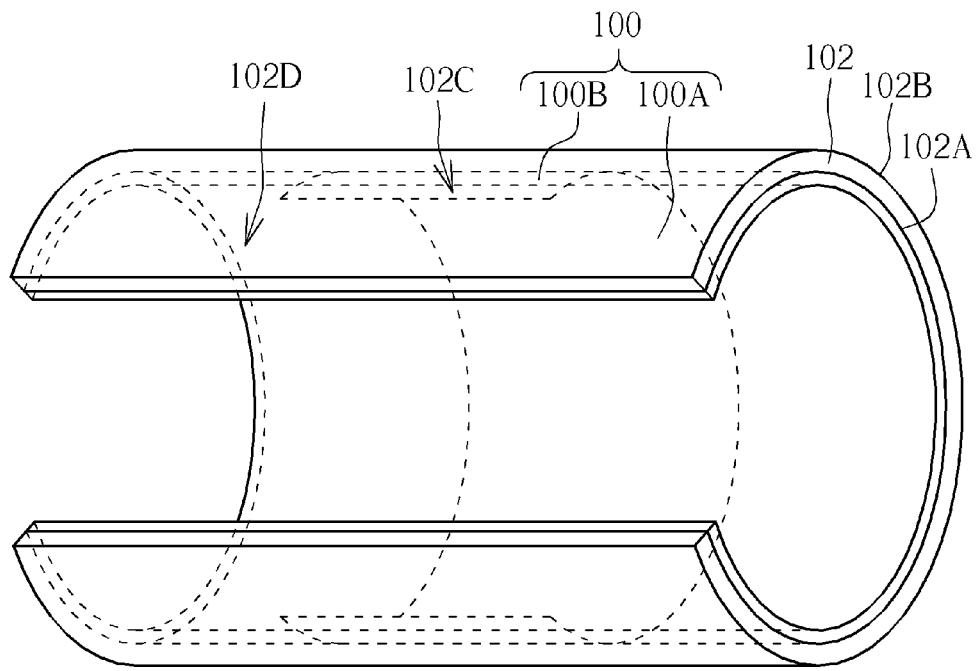
FIG. 5 is a schematic diagram illustrating a curved substrate according to an alternative embodiment of the present invention.

The shape of the alignment marks 104 may not be limited to L-shaped and can be adjusted for design considerations. In other embodiments, the curved substrate 102 may not include the alignment marks 104, and the position of light-transmitting region 102C and the peripheral region 102D may be decided by the second part 100B and the first part 100A stuck on the inner surface 102A. In the present embodiment, the curved substrate 102 may be a ring structure (or a tube structure) and has two ring side edges opposite to each other, but not limited thereto. In other embodiments, the curved substrate 102 may be an arc-shaped structure with two arc-shaped side edges opposite to each other and two even side edges, as shown in FIG. 5, but not limited thereto.

Figure 6:
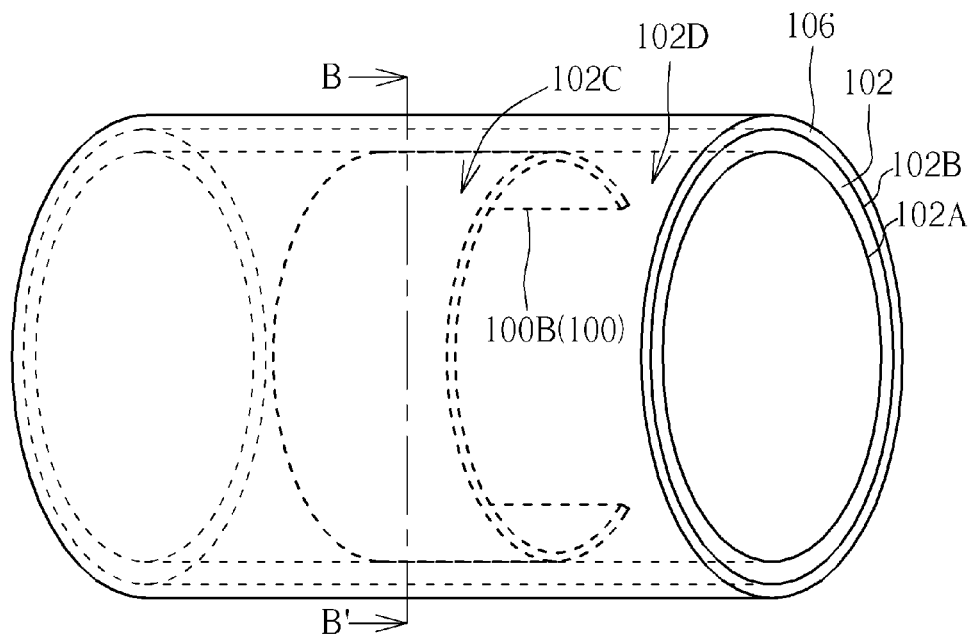
FIG. 6 is a schematic diagram illustrating the step of removing the first part of the first flexible film according to the first embodiment of the present invention.
Figure 7:
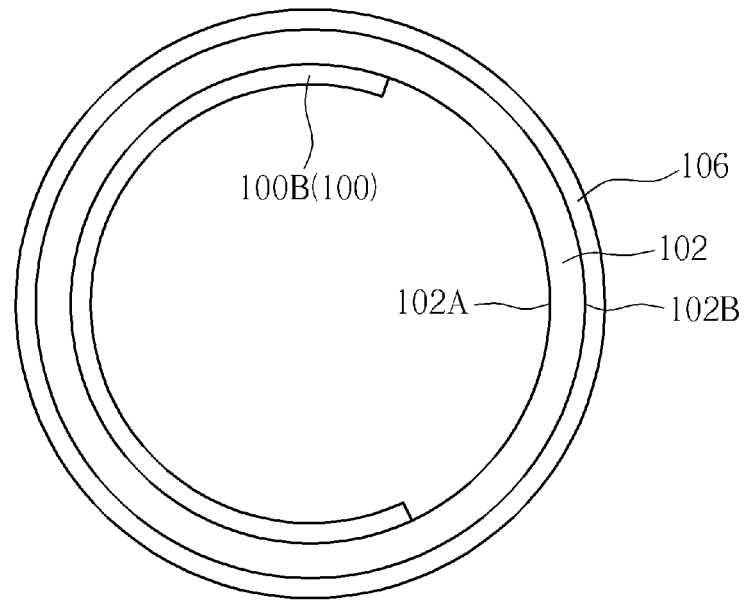
FIG. 7 is a cross-sectional view taken along line B-B' of FIG. 6.
Figure 8:
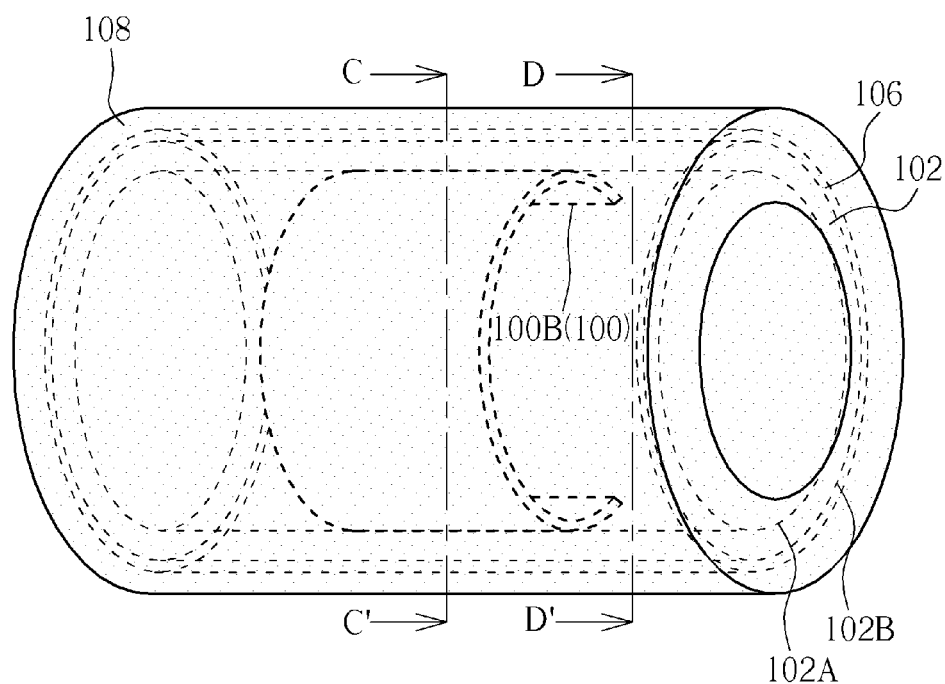
FIG. 8 is a schematic diagram illustrating the step of forming a decoration material layer on the exposed inner surface and the second part according to the first embodiment of the present invention.
Figure 11:
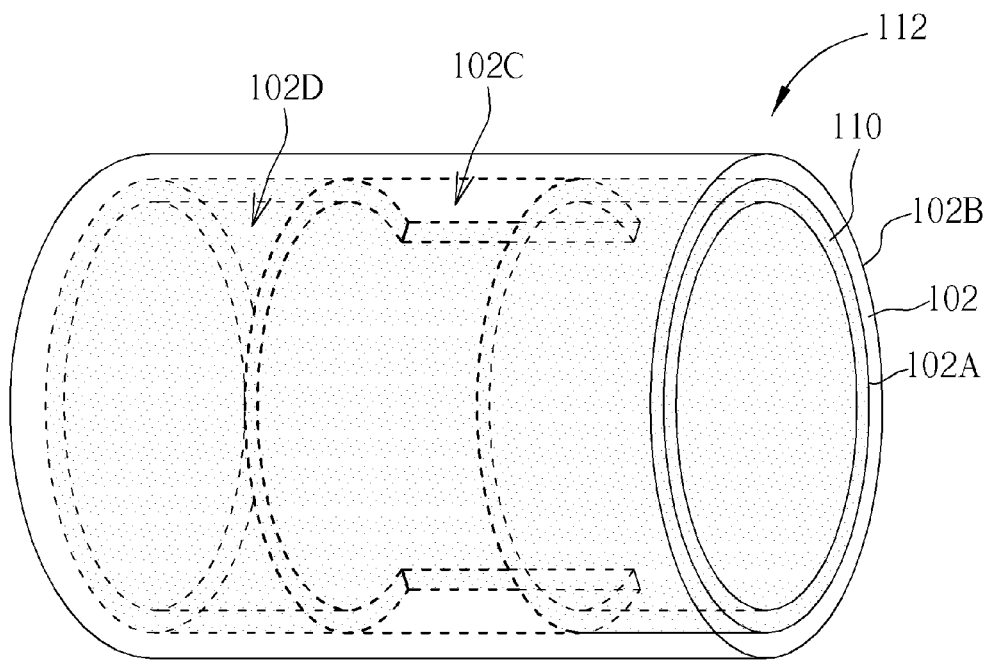
FIG. 11 a schematic diagram illustrating the step of removing the second part and the decoration material layer disposed on the second part according to the first embodiment of the present invention.

To clarify the relative position of the peripheral region and the light-transmitting region, the viewing directions to the first flexible film 100 of FIG. 6 and FIG. 8 and FIG. 11 in the subsequent steps are opposite to the viewing direction to the first flexible film 100 of FIG. 4. In other words, FIG. 6, FIG. 8 and FIG. 11 show the structure in the reverse side of FIG. 4. As shown in FIG. 6 and FIG. 7, the step S14 is next performed to remove the first part 100A of the first flexible film 100 and the inner surface 102A in the peripheral region 102D is exposed. Then, a second flexible film 106 is stuck on the outer surface 102B. In the present embodiment, the second flexible film 106 and the first flexible film 100 may be made of the same material and have the same structure. For instance, the second flexible film 106 may include a second thin film (not shown in the figures) and a second adhesive layer (not shown in the figures) and the second adhesive layer is stuck on a surface of the second thin film so as to stick the second flexible film 106 on the outer surface 102B. A material of the second thin film may include a flexible thin film material, such as polyethylene terephthalate (PET) or polyethylene (PE), but the present invention is not limited thereto. The structure and material of the second flexible film 106 may also be different from the first flexible film 100. It is worth noting that the thickness and stickiness of the first adhesive layer 100D and the second adhesive layer may be adjusted for design considerations. For example, in the step of removing the first part 100A, the first adhesive layer 100D may not only attach to the inner surface 102A but also can be easily tore off from the inner surface 102A and not easily be left on the inner surface 102A. In addition, the second adhesive layer needs to be easily removed from the outer surface 102B to prevent from affecting the appearance of the curved decoration plate due to residues of the second adhesive layer on the outer surface 102B. In other embodiments, the second flexible film 106 may be stuck on the outer surface 102B before the step of sticking the first flexible film 100 on the inner surface 102A or between the step of sticking the first flexible film 100 on the inner surface 102A and the step of removing the first part 100A.

Figure 9:
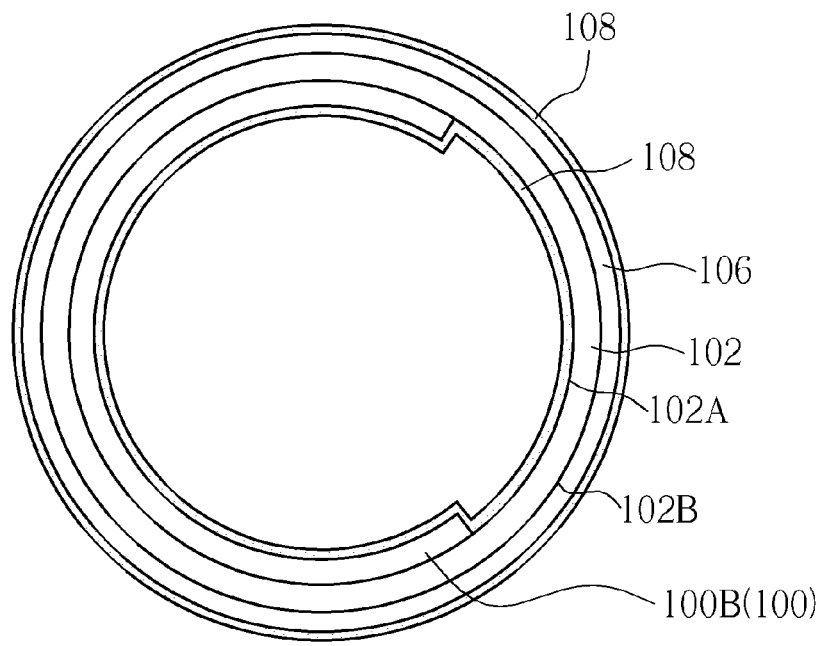
FIG. 9 is a cross-sectional view taken along line C-C' of FIG. 8.
Figure 10:
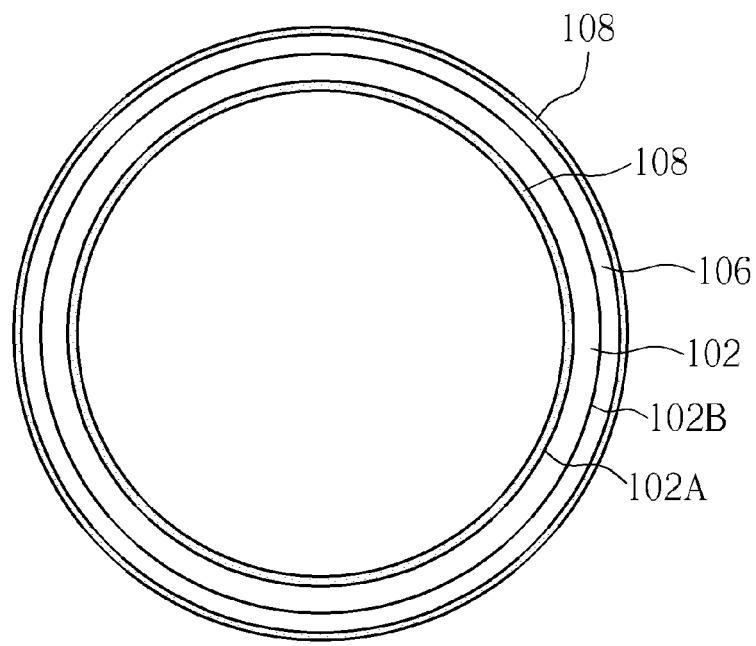
FIG. 10 is a cross-sectional view taken along line D-D' of FIG. 8.

As shown in FIG. 8 to FIG. 10, then, the step S15 is performed to form a decoration material layer 108 on the exposed inner surface 102A, the second part 100B and the second flexible film 106. In the present embodiment, the step of forming the decoration material layer 108 may include performing a physical vapor deposition process such as vacuum evaporation, sputtering or ion plating, but not limited thereto, the decoration material layer 108 therefore covers the inner surface 102A and two ring side edges of the curved substrate 102 and the second flexible film 106. Furthermore, the physical vapor deposition process prevents the contamination caused by using conventional plating solutions. The step of forming the decoration material layer 108 may include other coating processes such as a chemical vapor deposition process. It is worth noting that the thickness of the decoration material layer 108 is thinner than the thickness of the first flexible film 100 such that the second part 100B is easily found and removed from the inner surface 102A in the subsequent step of removing the second part 100B. In addition, the material of the decoration material layer 108 may include metal such as copper, nickel or aluminum, or light-shielding insulation materials such as photoresist materials, but not limited thereto. In addition, the shape and color of the decoration material layer 108 may be adjusted for design considerations.

In other embodiments, between the step of removing the first part 100A and the step of forming the decoration material layer 108 may selectively include a cleaning process so as to clean the exposed inner surface 102A of the curved substrate 102 and assist the adhesion of the decoration material layer 108 to the inner surface 102A.

As shown in FIG. 11, then, the step S16 is performed to remove the second part 100B and the decoration material layer 108 disposed on the second part 100B and remove the second flexible film 106 and the decoration material layer 108 disposed on the second flexible film 106 to form a decoration pattern layer 110 on the inner surface 102A of the peripheral region 102D. At this point, the fabrication of the curve decoration plate 112 in the present embodiment is completed.

It is worth noting that, in the method for fabricating the curved decoration plate 112, the first flexible film 100 is pre-cut to form the first part 100A and the second part 100B such that the first part 100A and the second part 100B can be separated by tearing off while they are still connected to each other. Therefore, the first part 100A attached on the curved substrate 102 can be removed while the second part 100B still remain on the curved substrate 102. Furthermore, the decoration material layer 108 formed on the second part 100B may also be removed by tearing up. As a result, the decoration pattern layer 110 can be formed on the curved inner surface 102A and therefore the problem of conventional screen printer unable to form the decoration pattern layer on the curved surface can be solved.

The method for fabricating the curved decoration plate is not limited by the aforementioned embodiment, and may have other different preferred embodiments. To simplify the description, the identical components in each of the following embodiments are marked with identical symbols. For making it easier to compare the difference between the embodiments, the following description will detail the dissimilarities among different embodiments and the identical features will not be redundantly described.

Figure 12:
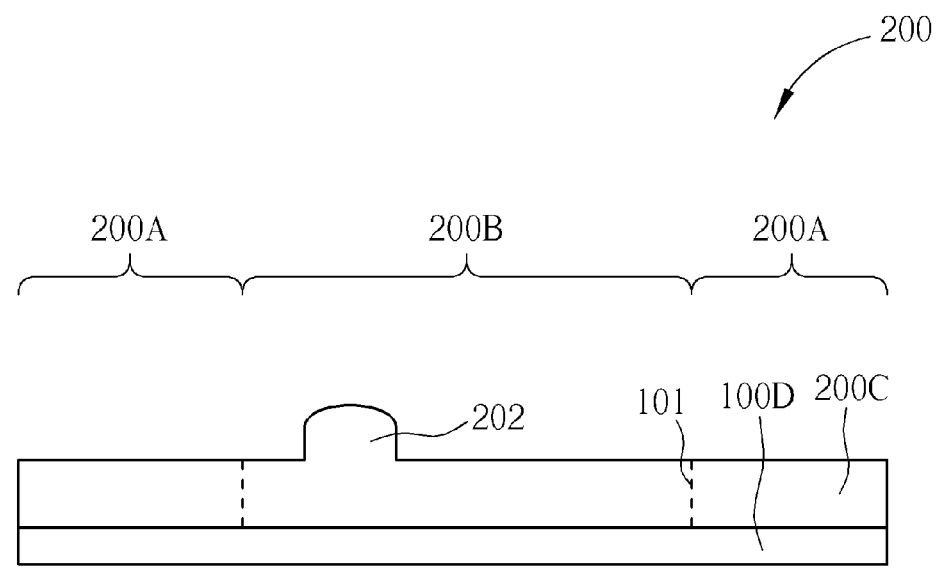
FIG. 12 is a cross-sectional schematic diagram illustrating a first flexible film according to a second embodiment of the present invention.
Figure 13:
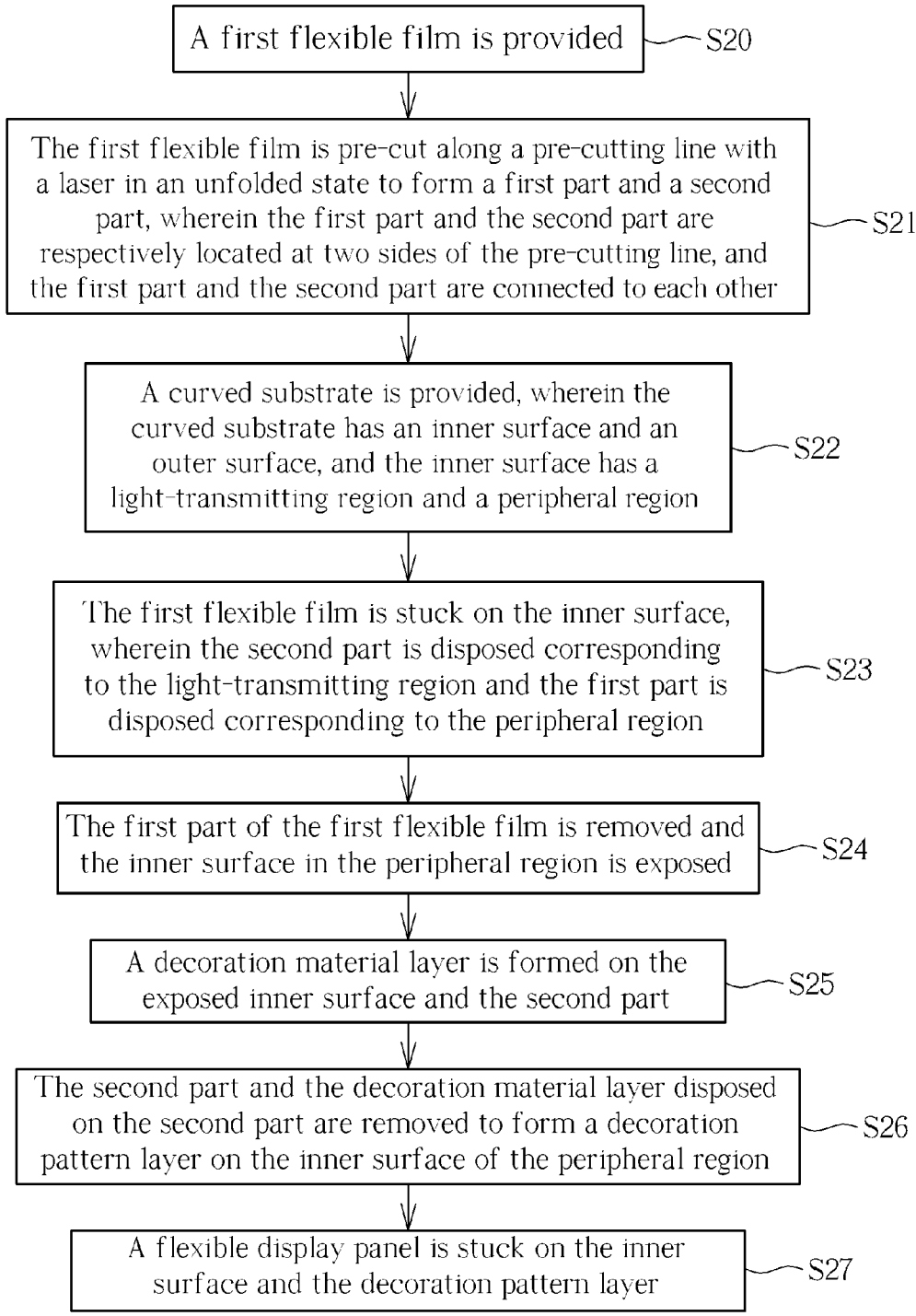
FIG. 13 is a flowchart schematically illustrating a method for fabricating a curved display device according to an embodiment of the present invention.

Please refer to FIG. 12, and also refer to FIG. 4, and FIG. 6 to FIG. 11. As shown in FIG. 12, the difference between the present embodiment and the first embodiment is that the first thin film 200C of the first flexible film 200 in this embodiment may further include an extending portion 202, and the extending portion 202 does not contact the first adhesive layer 100D. In the present embodiment, in the step of pre-cutting the first flexible film 200 along the pre-cutting line 101 with the laser, the extending portion 202 is a part of the second part 200B. The subsequent steps after the step of pre-cutting the first flexible film 200 are the same as the subsequent steps in the first embodiment, as shown in FIG. 4, and FIG. 6 to FIG. 11, and thus will not be redundantly described. It is worth noting that the extending portion 202 does not contact the first adhesive layer 100D such that the second part 200B and the decoration material layer 108 disposed on the second part 200B may easily be removed from the inner surface 102A via the extending portion 202 in the step of removing the second part 200B and the decoration material layer 108 disposed on the second part 200B. The extending portion 202 may be made of the same material as the first thin film 200C such as polyethylene terephthalate (PET) or polyethylene (PE), but the present invention is not limited thereto, the material of the extending portion 202 may also be different from the first thin film 200C.

The present invention further provides a method for fabricating a curved display device applying the method for fabricating the curved decoration plate 112. As shown in FIG. 13, FIG. 2 to FIG. 4 and FIG. 6 to FIG. 11, the method for fabricating the curved display device 116 includes the following steps:

Step S20: A first flexible film 100 is provided.

Step S21: The first flexible film 100 is pre-cut along a pre-cutting line 101 with a laser in an unfolded state to form a first part 100A and a second part 100B, wherein the first part 100A and the second part 100B are respectively located at two sides of the pre-cutting line 101, and the first part 100A and the second part 100B are connected to each other.

Step S22: A curved substrate 102 is provided, wherein the curved substrate 102 has an inner surface 102A and an outer surface 102B, and the inner surface 102A has a light-transmitting region 102C and a peripheral region 102D.

Step S23: The first flexible film 100 is stuck on the inner surface 102A, wherein the second part 100B is disposed corresponding to the light-transmitting region 102C and the first part 100A is disposed corresponding to the peripheral region 102D.

Step S24: The first part 100A of the first flexible film 100 is removed and the inner surface 102A in the peripheral region 102D is exposed.

Step S25: A decoration material layer 108 is formed on the exposed inner surface 102A and the second part 100B.

Step S26: The second part 100B and the decoration material layer 108 disposed on the second part 100B are removed to form a decoration pattern layer 110 on the inner surface 102A of the peripheral region 102D.

Step S27: A flexible display panel 114 is stuck on the inner surface 102A and the decoration pattern layer 110.

Figure 14:
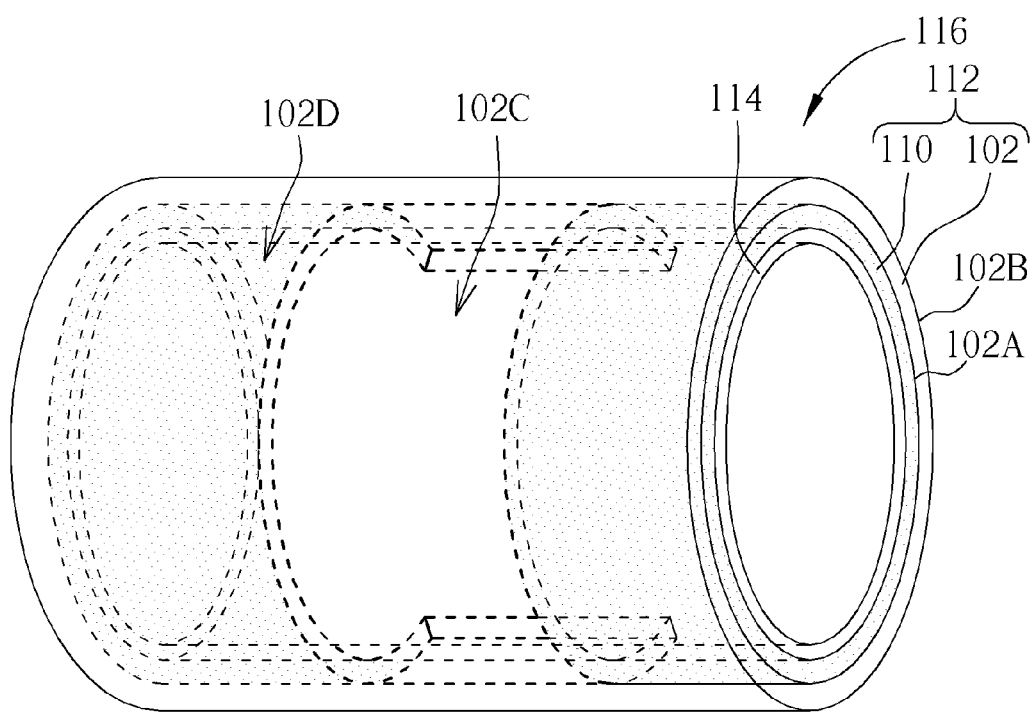
FIG. 14 is a schematic diagram illustrating a curved display device according to an embodiment of the present invention.

As shown in FIG. 14, after finishing the curved decoration plate 112, namely, step S20 to step S26, the step S27 is performed to stick a flexible display panel 114 on the inner surface 102A and the decoration pattern layer 110 so as to form a curved display device 116. The method for fabricating the curved decoration plate 112 of the curved display device 116 in the present embodiment may employ the fabricating method of any embodiment described above and will not be redundantly described. In the present embodiment, the flexible display panel 114 may include an organic light emitting diode (OLED) display panel, an electrophoretic display (EPD) panel or other suitable materials for a flexible display panel, but the present invention is not limited thereto.

In conclusion, in the method for fabricating the curved decoration plate and the method for fabricating the curved display device of the present invention, the first flexible film is pre-cut to form a first part and a second part so as to let the first part and the second part be still connected to each other but can be tore off to be separated from each other. In other words, the first part stuck on the curved substrate can easily be removed while the second part is still stuck on the curved substrate. Therefore, the decoration material layer disposed on the second part may be removed by easily tearing the second part off. As a result, the decoration pattern layer may be formed on the curved inner surface and therefore the problem of the conventional screen printer that could not form a decoration pattern layer on the curved inner surface can be solved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a curved decoration plate, comprising the following steps:
   providing a first flexible film;
   pre-cutting the first flexible film along a pre-cutting line with a laser in an unfolded state to form a first part and a second part, wherein the first part and the second part are respectively located at two sides of the pre-cutting line, and the first part and the second part are connected to each other;
   providing a curved substrate, wherein the curved substrate has an inner surface and an outer surface, and the inner surface has a light-transmitting region and a peripheral region;
   sticking the first flexible film on the inner surface, wherein the second part is disposed corresponding to the light-transmitting region, and the first part is disposed corresponding to the peripheral region;
   removing the first part of the first flexible film and exposing the inner surface in the peripheral region;
   forming a decoration material layer on the exposed inner surface and the second part; and
   removing the second part and the decoration material layer disposed on the second part to form a decoration pattern layer on the inner surface of the peripheral region.

2. The method for fabricating the curved decoration plate according to claim 1, wherein the curved substrate is a ring structure.

3. The method for fabricating the curved decoration plate according to claim 1, wherein the curved substrate is an arc-shaped structure.

4. The method for fabricating the curved decoration plate according to claim 1, wherein the first flexible film has a thin film and an adhesive layer, and the adhesive layer is stuck on a surface of the thin film, wherein in the step of pre-cutting the first flexible film, the laser does not cut off the adhesive layer, and the first flexible film is stuck on the inner surface via the adhesive layer.

5. The method for fabricating the curved decoration plate according to claim 4, wherein a material of the thin film includes polyethylene terephthalate (PET) and polyethylene (PE).

6. The method for fabricating the curved decoration plate according to claim 4, wherein the thin film comprises an extending portion and the extending portion does not contact the adhesive layer.

7. The method for fabricating the curved decoration plate according to claim 6, wherein in the step of pre-cutting the first flexible film, the extending portion is a part of the second part.

8. The method for fabricating the curved decoration plate according to claim 1, wherein the curved substrate further comprises two alignment marks, and the step of sticking the first flexible film on the inner surface includes aligning two corners of the first flexible film to the alignment marks respectively.

9. The method for fabricating the curved decoration plate according to claim 1, further comprising:
   sticking a second flexible film on the outer surface before the step of forming the decoration material layer, wherein the step of forming the decoration material layer further comprises forming the decoration material layer on the second flexible film; and removing the second flexible film and the decoration material layer disposed on the second flexible film after the step of forming the decoration material layer.

10. The method for fabricating the curved decoration plate according to claim 1, wherein the step of forming the decoration material layer comprises performing a physical vapor deposition process.

11. The method for fabricating the curved decoration plate according to claim 1, wherein a thickness of the decoration material layer is thinner than a thickness of the first flexible film.

12. A method for fabricating a curved display device, comprising the following steps:

providing a first flexible film;

pre-cutting the first flexible film along a pre-cutting line with a laser in an unfolded state to form a first part and a second part, wherein the first part and the second part are respectively located at two sides of the pre-cutting line, and the first part and the second part are connected to each other;

providing a curved substrate, wherein the curved substrate has an inner surface and an outer surface, and the inner surface has a light-transmitting region and a peripheral region;

sticking the first flexible film on the inner surface, wherein the second part is disposed corresponding to the light-transmitting region, and the first part is disposed corresponding to the peripheral region;

removing the first part of the first flexible film and exposing the inner surface in the peripheral region;

forming a decoration material layer on the exposed inner surface and the second part;

removing the second part and the decoration material layer disposed on the second part to form a decoration pattern layer on the inner surface of the peripheral region; and sticking a flexible display panel on the inner surface and the decoration pattern layer.

\* \* \* \* \*